(12) United States Patent
Jansen

(10) Patent No.: US 12,481,226 B2
(45) Date of Patent: Nov. 25, 2025

(54) INTERFEROMETER SYSTEM, POSITIONING SYSTEM, A LITHOGRAPHIC APPARATUS, A JITTER DETERMINATION METHOD, AND A DEVICE MANUFACTURING METHOD

(71) Applicant: ASML NETHERLANDS B.V., Veldhoven (NL)

(72) Inventor: Maarten Jozef Jansen, Hoogeloon (NL)

(73) Assignee: ASML NETHERLANDS B.V., Veldhoven (NL)

( * ) Notice: Subject to any disclaimer, the term of this patent is extended or adjusted under 35 U.S.C. 154(b) by 208 days.

(21) Appl. No.: 18/269,547

(22) PCT Filed: Dec. 12, 2021

(86) PCT No.: PCT/EP2021/085336
§ 371 (c)(1),
(2) Date: Jun. 23, 2023

(87) PCT Pub. No.: WO2022/152479
PCT Pub. Date: Jul. 21, 2022

(65) Prior Publication Data
US 2024/0061351 A1 Feb. 22, 2024

(30) Foreign Application Priority Data
Jan. 14, 2021 (EP) .................................. 21151514

(51) Int. Cl.
*G03F 7/00* (2006.01)
*G01B 9/02003* (2022.01)
*G01B 9/02055* (2022.01)

(52) U.S. Cl.
CPC ..... *G03F 7/70775* (2013.01); *G01B 9/02003* (2013.01); *G01B 9/0207* (2013.01)

(58) Field of Classification Search
CPC ............ G01B 9/02003; G01B 9/02012; G01B 9/0207; G03F 7/70775
See application file for complete search history.

(56) References Cited

U.S. PATENT DOCUMENTS 5,227,857 A 7/1993 Kersey
5,369,520 A 11/1994 Avramopoulos et al.
(Continued)

FOREIGN PATENT DOCUMENTS

EP 0901245 3/1999
RU 2719635 4/2020

OTHER PUBLICATIONS

International Search Report and Written Opinion issued in corresponding PCT Patent Application No. PCT/EP2021/085336, dated Mar. 21, 2022.

*Primary Examiner* — Michael A Lyons
(74) *Attorney, Agent, or Firm* — PILLSBURY WINTHROP SHAW PITTMAN, LLP

(57) ABSTRACT

An interferometer system includes an optics system configured to allow a first light beam to travel along a measurement path including a target, and a second light beam to travel along a fixed reference path excluding the target; and a signal generator configured to introduce a power-modulated optical signal in the measurement path or the reference path to determine jitter caused by components of the interferometer system downstream of the signal generator.

20 Claims, 5 Drawing Sheets

(56) References Cited

U.S. PATENT DOCUMENTS

| | | | |
|---|---|---|---|
| 5,784,352 A * | 7/1998 | Swanson | G11B 7/0037 |
| | | | 369/53.13 |
| 5,798,852 A | 8/1998 | Billes et al. | |
| 6,020,964 A | 2/2000 | Loopstra et al. | |
| 6,952,253 B2 | 10/2005 | Lof et al. | |
| 2003/0038943 A1* | 2/2003 | Almarzouk | G01J 9/02 |
| | | | 356/450 |
| 2007/0058173 A1 | 3/2007 | Holzapfel | |
| 2010/0046003 A1 | 2/2010 | Le Floch et al. | |
| 2016/0206195 A1* | 7/2016 | Huang | A61B 3/1233 |
| 2019/0265019 A1 | 8/2019 | Jansen et al. | |

* cited by examiner

INTERFEROMETER SYSTEM, POSITIONING SYSTEM, A LITHOGRAPHIC APPARATUS, A JITTER DETERMINATION METHOD, AND A DEVICE MANUFACTURING METHOD

CROSS-REFERENCE TO RELATED APPLICATION

The application is a U.S. national phase entry of PCT Patent Application No. PCT/EP2021/085336 which was filed on Dec. 12, 2021, which claims priority of European Patent Application No. 21151514.3 which was filed on Jan. 14, 2021 and which is incorporated herein in its entirety by reference.

FIELD

The present invention relates to interferometer system and a positioning system comprising such an interferometer system. The present invention also relates to a lithographic apparatus comprising such a positioning system. The present invention further relates to a method for determining jitter in an interferometer system, and a method for manufacturing a device using a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Lithographic apparatus usually include one or more positioning systems to position an object such as a support for a patterning device, a substrate support or an optical element of a projection system or illumination system. Such positioning systems typically include interferometer systems which may be of the heterodyne type.

In a heterodyne interferometer system, one or more light sources are used to create a first light beam and a second light beam having a relatively small difference in frequency, which difference in frequency may be referred to as split frequency. A first portion of both light beams is tapped off and both first portions are made to interfere, after which the power of the interference result is detected by a reference detector while a second portion of the first light beam is allowed to travel along a measurement path, and a second portion of the first light beam is allowed to travel along a reference path. Both second portions are made to interfere and the power of the interference result is detected by a measurement detector. By evaluating an output signal from the measurement detector and comparing this with an output signal from the reference detector, information may be obtained about the optical path length difference of the measurement path and reference path from which e.g. position information of a target in the measurement path may be obtained.

The position information obtained may include errors originating from jitter caused by components in the interferometer system such as electronics and optical fibers, e.g. due to intermodal coupling and mode coupling stability issues. Jitter is thus limiting the measurement accuracy of the interferometer system.

SUMMARY

Considering the above, it is an object of the invention to provide an interferometer system allowing to at least partially compensate for jitter-based measurement errors.

According to an embodiment of the invention, there is provided an interferometer comprising:
 a light source configured to emit a first light beam and a second light beam;
 an optics system configured to allow the first light beam to travel along a measurement path including a target, and the second light beam to travel along a fixed reference path excluding the target; and
 a signal generator configured to introduce a power-modulated optical signal in the measurement path or the reference path to determine jitter caused by components of the interferometer system downstream of the signal generator.

According to another embodiment of the invention, there is provided a positioning system to determine a position of a moveable target relative to a reference, comprising:
 a measurement system to measure a position of the moveable target;
 an actuator system to move the moveable target; and
 a control unit to control the measurement system and the actuator system, wherein the measurement system comprises an interferometer system according to the invention.

According to another embodiment of the invention, there is provided a lithographic apparatus comprising a moveable target and a positioning system according to the invention.

According to a further embodiment of the invention, there is provided a method for determining jitter in an interferometer comprising a light source configured to emit a first light beam and a second light beam, and an optics system configured to allow the first light beam to travel along a measurement path including a target, and the second light beam to travel along a fixed reference path excluding the target, and wherein the method comprises the following steps:
 a. introducing a power-modulated optical signal in the measurement path or the reference path, wherein a frequency of the power-modulated optical signal is different from a difference between the first and second frequency;
 b. detecting the power-modulated optical signal after traveling along the measurement path or the reference path;

c. determining a phase of the detected power-modulated optical signal; and d. determining the jitter from the determined phase of the detected power-modulated optical signal.

According to yet another embodiment of the invention, there is provided a device manufacturing method wherein use is made of a lithographic apparatus according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
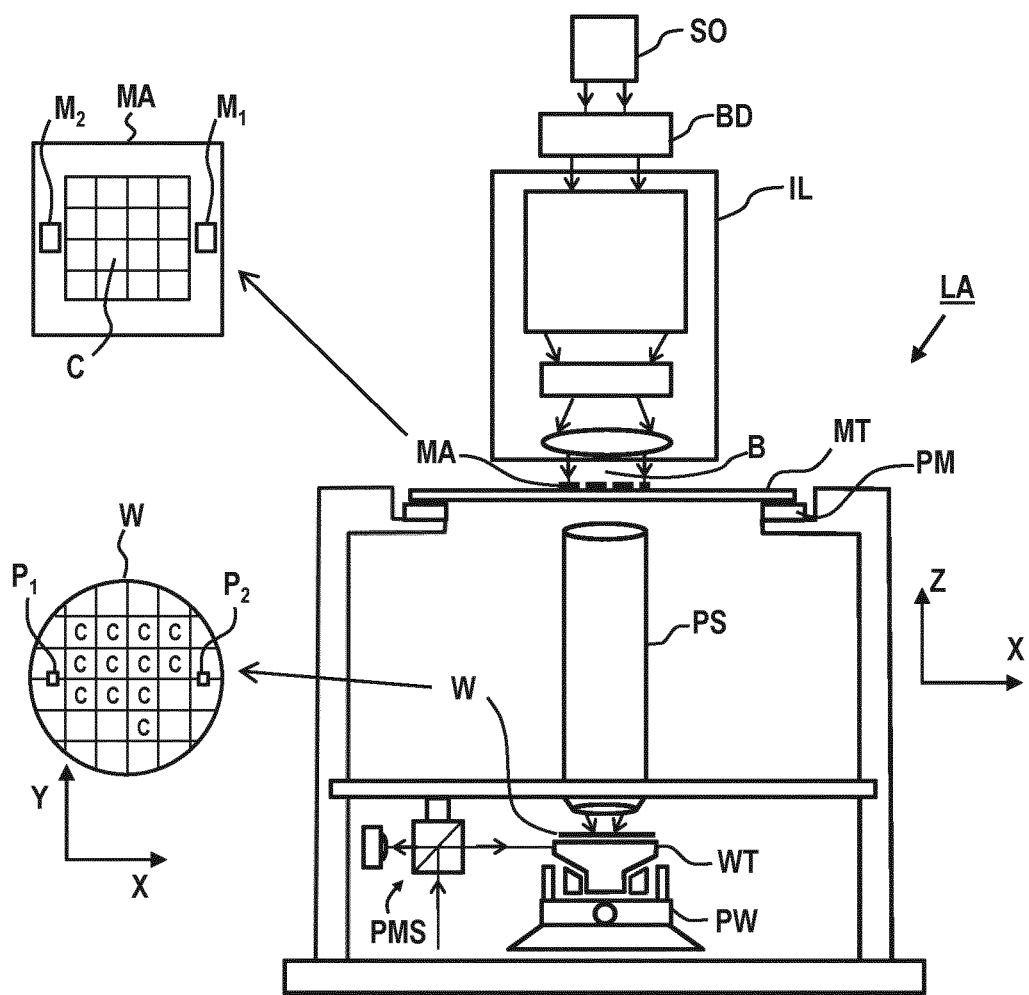
FIG. 1 depicts a schematic overview of a lithographic apparatus according to an embodiment of the invention.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
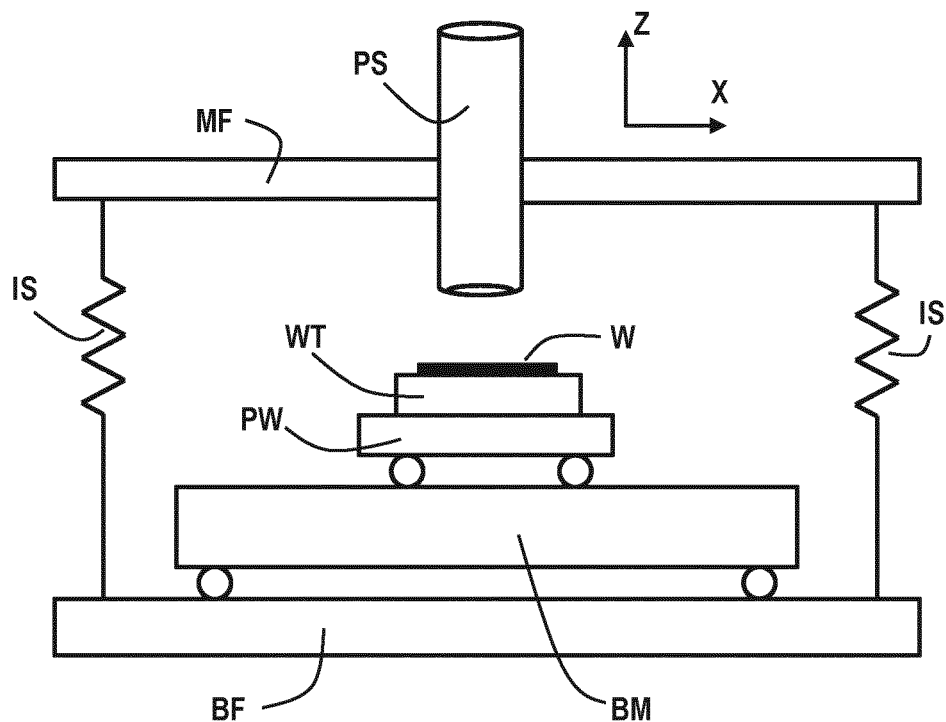
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads is arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
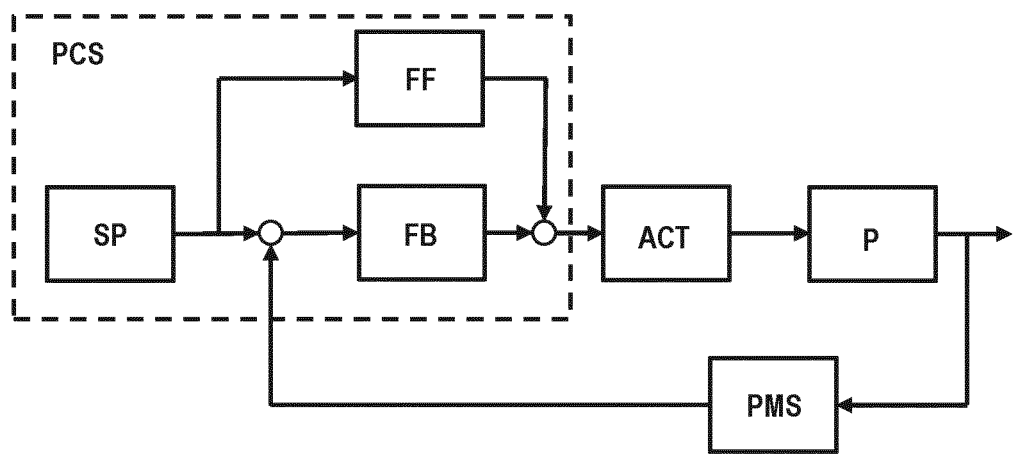
FIG. 3 schematically depicts a position control system as part of a positioning system according to an embodiment of the invention.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

FIGS. 4 to 8 schematically depict different embodiments of a heterodyne interferometer or heterodyne interferometer system HI as part of the position measurement system PMS mentioned above.

The interferometer HI includes a light source LS1. The light source LS1 may be a laser source providing a coherent light beam of a predetermined frequency.

The light source LS1 has an associated frequency shifter FS1 outputting a pair of light beams, namely a first light beam with a frequency f1 and a second light beam with a frequency f1+Δf1 resulting in a pair of light beams having a distinct split frequency Δf1.

The first and second light beams are combined by optical element LBC, for instance in such a way that the first light beam is orthogonally polarized to the second light beam, and directed towards a beam splitter BS. The beam splitter BS is configured to split each light beam into a first portion that is directed towards a reference detector RD and a second portion that is directed towards a first measurement detector MD1 and a second measurement detector MD2 via an optical assembly OA.

In this embodiment, the optical assembly OA includes an optical element OE and a reference mirror RM. The optical element OE thus receives from the beam splitter BS:
- a second portion of the first light beam, alternatively referred to as reference beam; and
- a second portion of the second light beam, alternatively referred to as measurement beam.

The optical assembly OA is configured to allow a portion of the reference beam to travel along a reference path with a fixed optical path length towards the first measurement detector MD1 and to allow another portion of the first reference beam to travel along a reference path with a fixed optical path length towards the second measurement detector MD2. In the schematic example of FIG. 4, the reference path leading to the first measurement detector MD1 starts at the beam splitter BS, runs via the optical element OE to the reference mirror RM, back to the optical element OE and ends on the first measurement detector MD1. The reference path leading to the second measurement detector MD2 starts at the beam splitter BS, runs via the optical element OE to the reference mirror RM, back to the optical element OE and ends on the second measurement detector MD2.

The optical assembly OA is further configured to allow a portion of the measurement beam to travel along a measurement path including a first target TA1 towards the first measurement detector MD1 and to allow another portion of the measurement beam to travel along a measurement path including a second target TA2 towards the second measurement detector MD2. In the schematic example of FIG. 4, the measurement path including first target TA1 starts at the beam splitter BS, runs via the optical element OE to the first target TA1, back to the optical element OE and ends on the first measurement detector MD1. The measurement path including second target TA2 starts at the beam splitter BS, runs via the optical element OE to the second target TA2, back to the optical element OE and ends on the second measurement detector MD2.

The first and second target TA1, TA2 may both be moveable targets, e.g. different mirrors or different positions on a mirror of an object, e.g. a substrate table WT or patterning device support MT, but may alternatively relate to different objects. Further, one or more targets may be fixed targets as used in so-called wavelength trackers.

The optical element OE may be or include one or more polarizing beam splitters to perform the function as described above.

Other reference paths and measurement paths are also envisaged. In an example, portions of the measurement beam are directed not once, but multiple times towards the first target TA1 and/or the second target TA2, respectively. The optical assembly OA, the beam splitter BS and possibly the optical element LBC, may be referred to as the optics system configured to receive a pair of light beams and to direct at least a portion of the light beams to at least one detector.

It is explicitly noted here that the entire heterodyne interferometer or heterodyne interferometer system, in particular the optics system and the detectors, are depicted highly schematically and elements may have been omitted for clarity reasons. For instance, properly arranged polarization-selective elements before a detector allowing the orthogonally polarized first and second beams to interfere at a detector are not separately depicted, neither are any quarter-wave plates depicted that are typically present between optical elements like optical element OE and/or a polarizing beam splitter and the first target TA1 or the second target TA2 and between optical elements like optical element OE and/or a polarizing beam splitter and the reference mirror RM. Other optical elements known to the skilled person in the art of heterodyne interferometry may also have been omitted, but may be present for a proper functioning of the heterodyne interferometer or heterodyne interferometer system HI. Further, as an example, in a more complex configuration, a plurality of light sources may be used, wherein each light source may have a separate beam delivery device including a separate reference detector per light source.

A characterizing feature is that the reference path and the measurement path are different so that a change of the difference between the paths can be measured. In case of a moveable target, a change of the difference in optical path length can be measured, thereby allowing to measure a position change of the moveable target TA. In case of a static target, a difference in environmental conditions may be measurable, e.g. a change in refractive index, and/or a frequency stability of the light source LS1 may be measurable, for instance by measuring a change in wavelength. It is also envisaged that the measurement path is such that the light beam is directed to and reflected by the moveable or fixed target multiple times to increase the optical path length and induced difference in optical path length when a displacement of the moveable target or change in environmental condition occurs.

Output signals of the reference detector RD, the first measurement detector MD1, and the second measurement detector MD2 are provided to a processing unit PU. It is also envisaged that a separate processing unit PU is provided per detector RD, MD1, MD2.

In an embodiment, the light source LS1 is a stabilized laser source, e.g. a Helium-Neon laser.

The interferometer system HI further includes a signal generator SG. FIGS. 4 to 8 depict different embodiments of the interferometer system HI which in principle result in different implementations of the signal generator SG as will be explained below in more detail.

Figure 4:
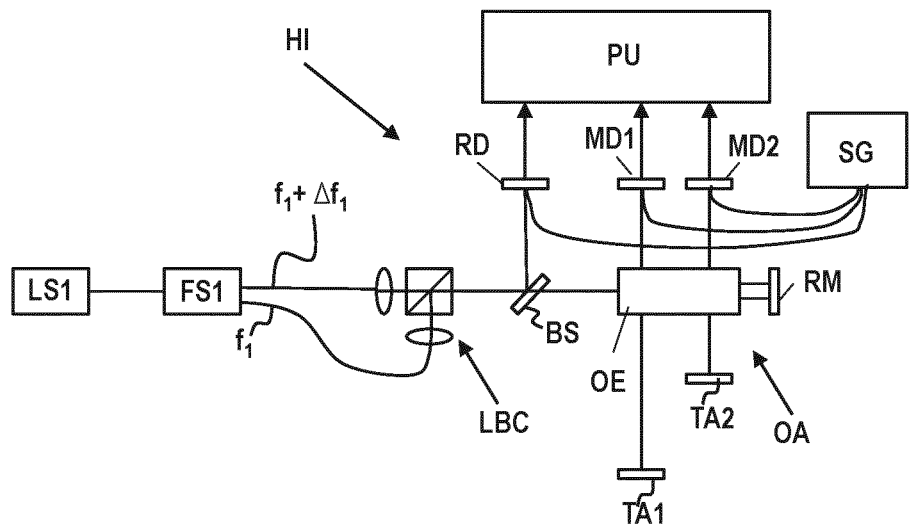
FIG. 4 schematically depicts an interferometer system according to an embodiment of the invention.

In FIG. 4, the signal generator SG is configured to introduce a power-modulated optical signal at the reference detector RD, the first measurement detector MD1 and the second measurement detector MD2. The processing unit PU is then preferably configured to determine jitter caused by electronics downstream of the respective detectors RD, MD1, MD2, which determined jitter can be used to compensate jitter in the measurements based on the first and second light beams using the same electronics.

Introducing the power-modulated optical signal at a detector may be carried out by providing the power-modulated optical signal to a receiving optical fiber of said detector, so that jitter introduced by instability in the coupling to or vibrations of the receiving fiber can also be determined.

Introducing the power-modulated optical signal at a detector may be carried out using an optical fiber between the signal generator SG and said detector, which optical fiber is preferably a single-mode fiber, or a fiber with a low intermodal dispersion coefficient like a gradient index fiber, as the use of a traditional multi-mode fiber may introduce the risk of introducing jitter caused by intermodal mixing.

Figure 5:
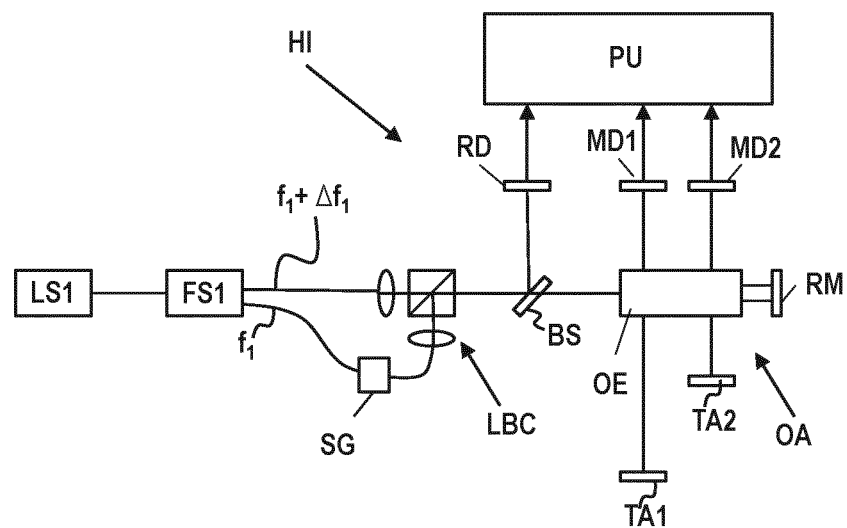
FIG. 5 schematically depicts an interferometer system according to another embodiment of the invention.

In FIG. 5, the signal generator SG is a modulator configured to introduce a power-modulated optical signal by power-modulating the first light beam traveling along the reference path. As a result, the jitter caused by components downstream of the signal generator SG can be determined by the processing unit PU to compensate jitter in the measurements based on the first and second light beams using the same components.

Figure 6:
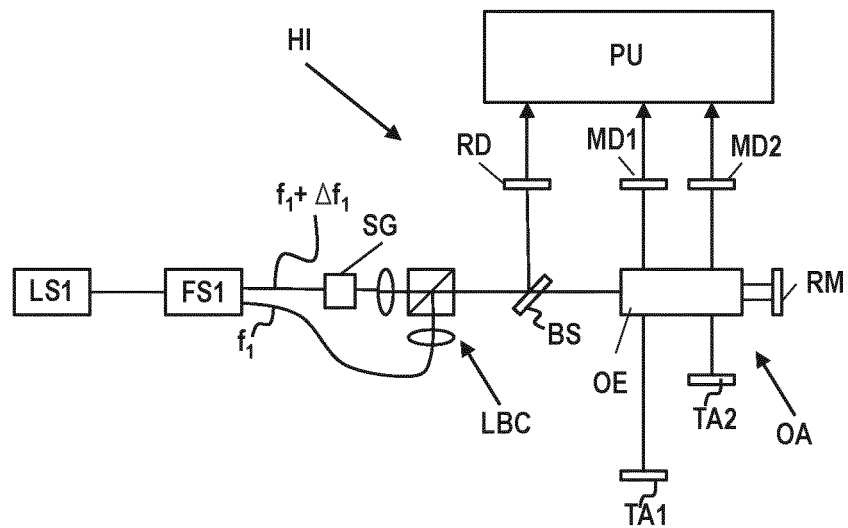
FIG. 6 schematically depicts an interferometer system according to a further embodiment of the invention.

In FIG. 6, the signal generator SG is a modulator configured to introduce a power-modulated optical signal by power-modulating the second light beam traveling along the measurement path. As a result, the jitter caused by components downstream of the signal generator SG can be determined by the processing unit PU to compensate jitter in the measurements based on the first and second light beam using the same components.

Figure 7:
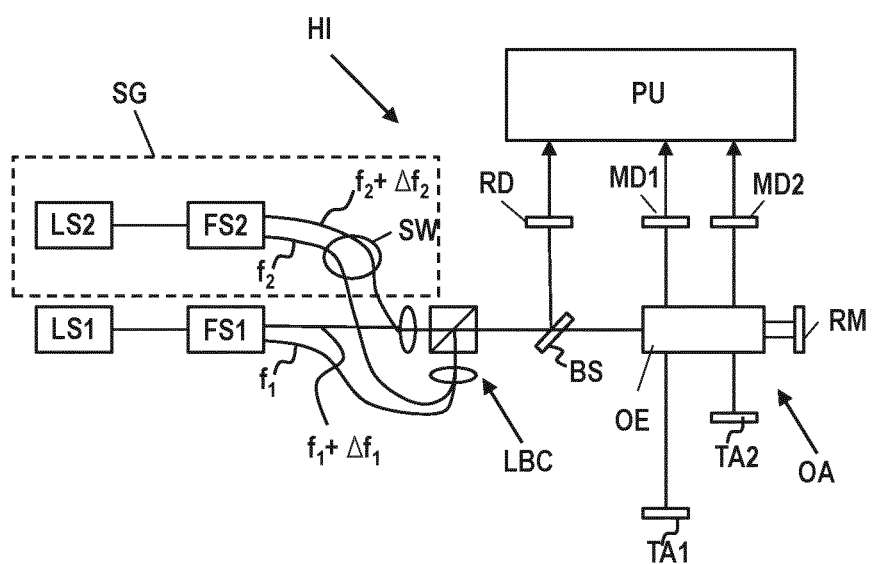
FIG. 7 schematically depicts an interferometer system according to yet another embodiment of the invention with a signal generator in interferometer mode.
Figure 8:
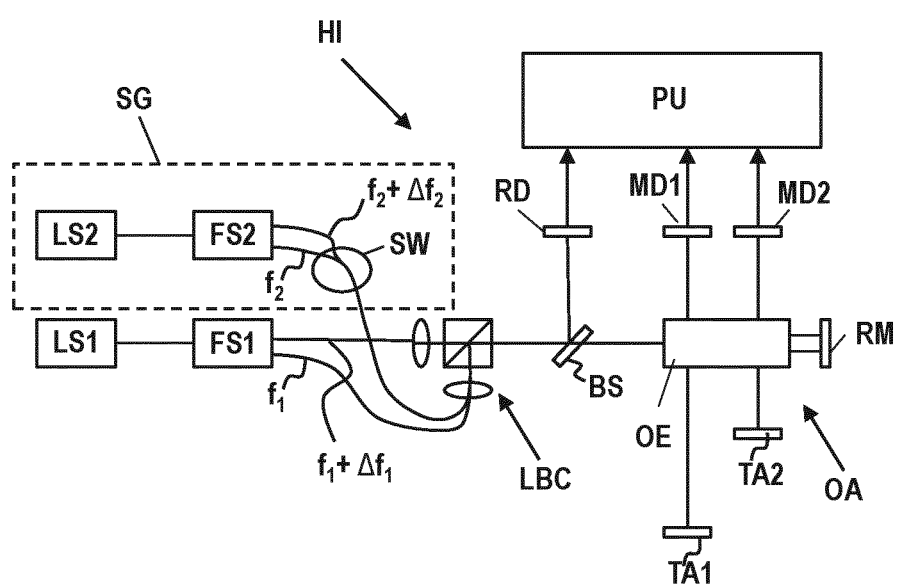
FIG. 8 schematically depicts the interferometer system of FIG. 7 with the signal generator in jitter determination mode.

In FIGS. 7 and 8, the signal generator SG includes a second light source LS2, which may be a laser source providing a coherent light beam of a predetermined frequency. The second light source LS2 has an associated frequency shifter FS2 outputting a pair of light beams, namely a third light beam with a frequency $f2$ and a fourth light beam with a frequency $f2+\Delta f2$ resulting in a pair of light beams having a distinct split frequency $\Delta f2$.

The signal generator SG further includes a switch device SW to switch between an interferometer mode as shown in FIG. 7 and a jitter determination mode as shown in FIG. 8.

In the interferometer mode, the third light beam is combined with the first light beam to travel along the reference path similar as the first light beam, and the fourth light beam is comgined with the second light beam to travel along the measurement path similar as the second light beam. Hence, in the interferometer mode, the signal generator SG can be used to provide additional interferometer measurement signal allowing e.g to more accurately determine a difference in optical path length, i.e. a position of a target, or allowing e.g. to zero the interferometer, i.e. determine an absolute position.

In the jitter determination mode, the third light beam and the fourth light beam are combined by the switch device SW and introduced into the reference path. As an alternative, not shown, the combined third and fourth light beam can be introduced into the measurement path. By combining the third and fourth light beams, a power-modulated optical signal is generated that can be used to determine jitter in the components downstream of the signal generator SG.

Although in the shown embodiments, pairs of light beams, e.g. the first and second light beams or the third and fourth light beams, are generated using a single light source and a frequency shifter, it will be apparent to the skilled person that there are a plurality of ways to generate such pairs of light beams, which may be summarized as being a light source configured to emit a pair of light beams.

Although in the shown embodiment, two targets TA1, TA2 have been used, the invention also applies to embodiments with only one target or a three or more targets.

Although no specific values have been given to frequencies mentioned in the above description, it is preferred that frequency f1 differs from frequency f2 and/or that split frequency $\Delta f1$ differs from frequency $\Delta f2$ and/or that a frequency, i.e. a modulation frequency, of the power-modulated optical signal differs from the frequencies f1 and f1+$\Delta f1$, and from split frequency $\Delta f1$.

Although in the shown embodiment, examples have been given with respect to heterodyne interferometer systems, the invention may very well be applied to homodyne interferometer systems as well.

Power-modulation may alternatively be referred to as amplitude-modulation.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below. Other aspects of the invention are set-out as in the following numbered clauses.

1. An interferometer system comprising:
    a light source configured to emit a first light beam and a second light beam;
    an optics system configured to allow the first light beam to travel along a measurement path including a target, and the second light beam to travel along a fixed reference path excluding the target; and
    a signal generator configured to introduce a power-modulated optical signal in the measurement path or the reference path to determine jitter caused by components of the interferometer system downstream of the signal generator.
2. An interferometer according to clause 1, wherein the light source is configured to emit the first light beam at a first frequency and the second light beam at a second frequency different from the first frequency.
3. An interferometer according to clause 2, wherein the signal generator is configured to introduce the power-modulated optical signal at a frequency different from a difference between the first and second frequency.
4. An interferometer system according to any of clauses 1-3, wherein the signal generator includes a modulator configured to power modulate the first light beam or the second light beam to introduce the power-modulated optical signal.
5. An interferometer system according to any of clauses 1-3, wherein the signal generator includes a modulator configured to provide a power-modulated further light beam, and wherein the signal generator is configured to add the power-modulated further light beam to the first light beam or the second light beam as power-modulated optical signal.
6. An interferometer system according to clause 2, wherein the signal generator is configured to provide a power-modulated further light beam by combining a third light beam having a third frequency with a fourth light beam having a fourth frequency different from the third frequency and such that a difference between the first and second frequency is different from a difference between the third and fourth frequency, and wherein the signal generator is configured to add the power-modulated further light beam to the first light beam or the second light beam as power-modulated optical signal.
7. An interferometer system according to clause 6, further comprising a switch device operatively connected to the signal generator to switch between a jitter determination mode in which the signal generator is able to add the power-modulated further light beam to the first light beam or the second light beam as power-modulated optical signal, and an interferometer mode in which the third light beam is allowed to travel along the measurement path and the fourth light beam is allowed to travel along the reference path.
8. An interferometer system according to any of clauses 1-7, wherein the signal generator is configured to introduce the power-modulated optical signal upstream of the target.

9. An interferometer system according to any of clauses 1-7, wherein the signal generator is configured to introduce the power-modulated optical signal downstream of the target.
10. An interferometer system according to clause 9, further comprising a detector at an end of the measurement path and the reference path to receive the first light beam and the second light beam, and wherein the signal generator is configured to introduce the power-modulated optical signal at the detector.
11. An interferometer system according to any of clauses 1-10, further including the target, which target is a static target.
12. An interferometer system according to any of clauses 1-11, further comprising a detector at an end of the measurement path and the reference path to receive the first and second light beams and a processing unit to determine a phase of the first and/or second light beam received at the detector and to determine jitter based on the power-modulated optical signal received at the detector.
13. A positioning system to determine a position of a moveable target relative to a reference, comprising:
a measurement system to measure a position of the moveable target;
an actuator system to move the moveable target; and
a control unit to control the measurement system and the actuator system, wherein the measurement system comprises an interferometer system according to any of clauses 1-12.
14. A lithographic apparatus comprising a moveable target and a positioning system according to clause 13.
15. A lithographic apparatus according to clause 14, further comprising:
an illumination system configured to condition a radiation beam;
a support constructed to support a patterning device, the patterning device being capable of imparting the radiation with a pattern in its cross-section to form a patterned radiation beam;
a substrate table constructed to hold a substrate; and
a projection system configured to project the patterned radiation beam onto a target portion of the substrate,
wherein the moveable target is the support or the substrate table.
16. A method for determining jitter in an interferometer comprising a light source configured to emit a first light beam and a second light beam, and an optics system configured to allow the first light beam to travel along a measurement path including a target, and the second light beam to travel along a fixed reference path excluding the target, and wherein the method comprises the following steps:
a. introducing a power-modulated optical signal in the measurement path or the reference path;
b. detecting the power-modulated optical signal after traveling along the measurement path or the reference path;
c. determining a phase of the detected power-modulated optical signal; and
d. determining the jitter from the determined phase of the detected power-modulated optical signal.
17. A method according to clause 16, further comprising the steps of determining a phase difference between the first light beam and the second light beam after traveling along the measurement path and the reference path, respectively, determining a jitter compensation value from the determined jitter, and compensating the phase difference using the jitter compensation value.
18. A method according to clause 16 or 17, further comprising the step of putting the interferometer system in a jitter determination mode by combining a third light beam having a third frequency with a fourth light beam having a fourth frequency different from the third frequency and such that a difference between the first and second frequency is different from a difference between the third and fourth frequency, and wherein in jitter determination mode introducing the power-modulated optical signal in step a. is carried out by adding the power-modulated further light beam to the first light beam or the second light beam as power-modulated optical signal.
19. A device manufacturing method wherein use is made of a lithographic apparatus according to clause 14 or 15.

The invention claimed is:
1. An interferometer system comprising:
an optics system configured to allow a first light beam to travel along a measurement path arranged to include a target, and a second light beam to travel along a fixed reference path arranged to exclude the target;
a signal generator configured to introduce a power-modulated optical signal in the measurement path or the reference path;
a detector system at an end of the measurement path and the reference path to receive the first and second light beams, the detector system comprising one or more detectors; and
a processing unit configured to determine a phase of the first and/or second light beam based on the power-modulated optical signal received at the detector system and to determine jitter caused by components of the interferometer system downstream of the signal generator.
2. The interferometer according to claim 1, further comprising a light source configured to emit the first light beam at a first frequency and the second light beam at a second frequency different from the first frequency.
3. The interferometer according to claim 2, wherein the signal generator is configured to introduce the power-modulated optical signal at a frequency different from a difference between the first and second frequency.
4. The interferometer system according to claim 2, wherein the signal generator is configured to provide a power-modulated further light beam by combining a third light beam having a third frequency with a fourth light beam having a fourth frequency different from the third frequency and such that a difference between the first and second frequency is different from a difference between the third and fourth frequency, and wherein the signal generator is configured to add the power-modulated further light beam to the first light beam or the second light beam as the power-modulated optical signal.
5. The interferometer system according to claim 4, further comprising a switch device operatively connected to the signal generator to switch between a jitter determination mode in which the signal generator is able to add the power-modulated further light beam to the first light beam or the second light beam as the power-modulated optical signal, and an interferometer mode in which the third light beam is allowed to travel along the measurement path and the fourth light beam is allowed to travel along the reference path.

6. The interferometer system according to claim 1, wherein the signal generator includes a modulator configured to power modulate the first light beam or the second light beam to introduce the power-modulated optical signal.

7. The interferometer system according to claim 1, wherein the signal generator includes a modulator configured to provide a power-modulated further light beam, and wherein the signal generator is configured to add the power-modulated further light beam to the first light beam or the second light beam as the power-modulated optical signal.

8. The interferometer system according to claim 1, wherein the signal generator is configured to introduce the power-modulated optical signal in the first light beam upstream of the target or in the second light beam upstream of a reference mirror.

9. The interferometer system according to claim 1, wherein the signal generator is configured to introduce the power-modulated optical signal in the first light beam downstream of the target or in the second light beam downstream of a reference mirror.

10. The interferometer system according to claim 9, wherein the signal generator is configured to introduce the power-modulated optical signal at the detector system.

11. The interferometer system according to claim 1, further including the target, which target is a static target.

12. A positioning system comprising:
a measurement system to measure a position of a moveable target;
an actuator system to move the moveable target; and
a control unit to control the measurement system and the actuator system,
wherein the measurement system comprises the interferometer system according to claim 1, wherein the target is the moveable target.

13. A lithographic apparatus comprising the moveable target and the positioning system according to claim 12.

14. The lithographic apparatus according to claim 13, further comprising:
an illumination system configured to condition a radiation beam;
a support constructed to support a patterning device, the patterning device being capable of imparting the radiation with a pattern in its cross-section to form a patterned radiation beam;
a substrate table constructed to hold a substrate; and
a projection system configured to project the patterned radiation beam onto a target portion of the substrate,
wherein the moveable target is the support or the substrate table.

15. A method for determining jitter in an interferometer comprising a light source configured to emit a first light beam and a second light beam, and an optics system configured to allow the first light beam to travel along a measurement path including a target, and the second light beam to travel along a fixed reference path excluding the target, and wherein the method comprises:
introducing a power-modulated optical signal in the measurement path or the reference path;
detecting the power-modulated optical signal after traveling along the measurement path or the reference path;
determining a phase of the detected power-modulated optical signal; and
determining the jitter from the determined phase of the detected power-modulated optical signal.

16. The method according to claim 15, further comprising determining a phase difference between the first light beam and the second light beam after traveling along the measurement path and the reference path, respectively, determining a jitter compensation value from the determined jitter, and compensating the phase difference using the jitter compensation value.

17. The method according to claim 15, further comprising putting the interferometer system in a jitter determination mode by combining a third light beam having a third frequency with a fourth light beam having a fourth frequency different from the third frequency and such that a difference between the first and second frequency is different from a difference between the third and fourth frequency, and wherein in jitter determination mode the introducing the power-modulated optical signal is carried out by adding the power-modulated further light beam to the first light beam or the second light beam as the power-modulated optical signal.

18. A device manufacturing method comprising manufacturing one or more devices and using the determined jitter from performing the method of claim 15 to configure the manufacturing.

19. The method according to claim 15, wherein the first light beam has a first frequency and the second light beam has a second frequency different from the first frequency.

20. The method according to claim 19, wherein the power-modulated optical signal is at a frequency different from a difference between the first and second frequency.

* * * * *